Aug. 11, 1964 W. N. JONES ETAL 3,144,618

TUNNEL DIODE CRYSTAL CONTROLLED OSCILLATOR

Filed Jan. 16, 1961

WITNESSES

John C. Heasley, Jr.

James F. Young

INVENTORS
Wesley N. Jones
& Jacob Beser

BY R. L. Brodahl

ATTORNEY

United States Patent Office 3,144,618

Patented Aug. 11, 1964

3,144,618

TUNNEL DIODE CRYSTAL CONTROLLED OSCILLATOR

Wesley N. Jones, Severna Park, and Jacob Beser, Pikesville, Md., assignors to Westinghouse Electric Corporation, East Pittsburgh, Pa., a corporation of Pennsylvania Filed Jan. 16, 1961, Ser. No. 82,848
4 Claims. (Cl. 331—107)

The present invention relates to tunnel diode oscillator circuits, and more particularly to crystal controlled tunnel diode oscillator circuits.

It is well known in the prior art that by placing an inductor in series with a suitably biased tunnel diode a relaxation oscillator can be obtained. The mathematical condition that must be satisfied for free sinusoidal oscillations requires that the sum of the real and imaginary part of the circuit input impedance be equal to zero. As the frequency of oscillation of a given oscillator circuit may vary due to many external conditions, such as temperature or atmospheric changes, to insure stable oscillation at a desired frequency it is necessary to provide compensating means within the oscillator circuit. A piezoelectric crystal lends itself readily to this compensatory application because of its accurately maintainable resonant frequency characteristic, and its particular rapid impedance change with frequency.

It is therefore an object of the present invention to provide an improved oscillator circuit utilizing a unique oscillatory circuit including a crystal operative with a tunnel diode wherein the frequency of oscillation is stabilized by a piezoelectric crystal.

It is a further object of the present invention to provide improved frequency controlled oscillator circuit employing a unique combination including a tunnel diode and a piezoelectric crystal to accurately control the frequency of oscillation.

Further objects and improvements will become more apparent from the following description and drawing, in which.

FIG. *5a* is a plot of the impedance versus frequency characteristic of a piezoelectric crystal; and, FIG. *5b* is a plot of the phase angle versus frequency of the piezoelectric crystal of FIG. *5a*.

Figure 1:
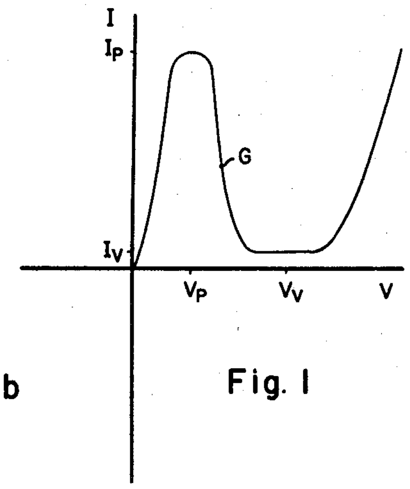
FIGURE 1 shows a plot of the current versus voltage characteristic of a typical tunnel diode in the forward direction.

For purposes of clarity, the current-voltage characteristics of tunnel diode will be discussed with reference to FIG. 1. Beginning at the origin O a tunnel diode has the characteristics of an ordinary diode in the forward direction, i.e. of a relatively high positive conductance; this region of positive conductance continues until the peak voltage $V_P$ is reached, where the peak current $I_P$ is shown. The slope of the point $I_P$, $V_P$ is zero, thus the conductance of the tunnel diode at this point is zero. Now with increasing voltage V the current through the diode in its forward direction decreases creating a region of negative conductance. With increasing voltage V the current I further decreases until a valley voltage $V_V$ is reached at a valley current $I_V$. The current I then increases from the valley point with increasing voltage as an ordinary diode in the forward direction. In a typical oscillator circuit, a tunnel diode would be biased in the negative conductance region, for example, at point G of FIGURE 1.

Figure 2:
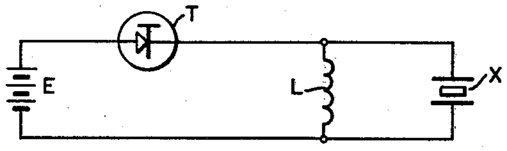
FIG. 2 is a schematic diagram of one embodiment of the present invention.

FIG. 2 shows a direct current source E having its positive terminal connected to the anode of a tunnel diode T. An inductor L and a piezoelectric crystal X are connected in parallel, and their common terminals are connected respectively to the cathode of the tunnel diode T and the negative terminal of the source E.

Figure 3:
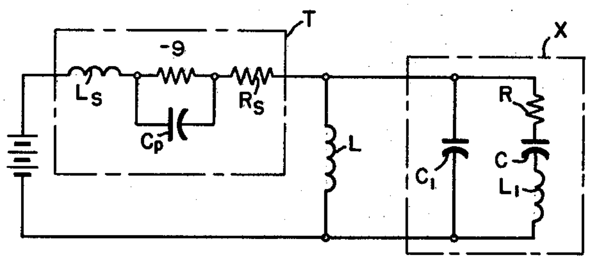
FIG. 3 is an equivalent circuit of one embodiment of FIGURE 1.

Referring to FIG. 3, equivalent circuits for the tunnel diode T and the crystal X replace the symbols for the elements in FIG. 2 and are so designated within the dotted boxes. The equivalent circuit of the tunnel diode T is shown as having an inductor $L_s$ and a resistor $R_s$ connected in series by a parallel combination of a capacitor $C_P$ and a negative conductance $-g$. When the tunnel diode T is biased in its negative conductance region, the tunnel diode has a capacitive reactive characteristic. The equivalent circuit for the piezoelectric crystal X within the dotted block shows a capacitor $C_1$ in parallel with the series combination of the resistor R, the capacitor C and the inductor $L_1$. As is shown in FIG. *5a*, the crystal X has impedance characteristic such that the series resonant frequency $f_1$ is where $$2\pi f_1 L = \frac{1}{2\pi f_1 C}$$

The parallel resonant frequency $f_2$ is where the series $L_1CR$ branch has an inductive reactance equal to the capacitive reactance $$\frac{1}{2\pi f_2 C_1}$$

The crystal X has an inductive characteristic between the frequencies $f_1$ and $f_2$, and at frequencies higher than the parallel resonant frequency $f_2$ the characteristic becomes capacitive, which is better shown in FIG. *5b*. For further explanation of the characteristics of a piezoelectric crystal, see Terman, Electronic and Radio Engineering (fourth edition, 1955), section 14–10, pages 508–510.

For the purpose of explaining the operation of the oscillator of FIGURE 2, consider for the moment that the crystal X is not in the oscillator circuit, so that the circuit consists of the direct current source E, the tunnel diode T and the inductor L. The frequency of oscillation of the circuit is chosen to be $f_3$ as is shown in FIG. *5a*. The frequency $f_3$ is taken as slightly higher than the parallel resonant frequency $f_2$ of the crystal X. The inductor L and the capacitive characteristic of the tunnel diode T when biased in its negative conductance region determines the frequency $f_3$. Then considering the case with the crystal X in the circuit, as shown in FIG. 2; since the crystal has a capacitive characteristic in the region between $f_2$ and $f_3$, the increased capacitive reactance due to the crystal being in parallel with the inductor L will cause the total inductance of this parallel combination to increase. More inductance being introduced in the circuit will cause the oscillating frequency of the circuit to decrease to the circuit stable oscillator frequency, shown as $f_0$ in FIG. *5a*. To show the stability of the frequency of operation $f_0$, if for example the frequency of oscillation should drop from $f_0$ toward $f_2$, the impedance of the crystal $Z_X$ rises and so the capacitance of the crystal decreases, which decreases the value of the total inductance seen by the capacitive characteristic of the tunnel diode; this causes the frequency of oscillation then to be driven back to its original operating frequency $f_0$. If on the other hand the frequency should increase from $f_0$ toward $f_3$, the impedance $Z_X$ of the crystal decreases and so the capacitance of the crystal increases; thus the total parallel inductance seen by the tunnel diode T is increased and the frequency of oscillation will then decrease back to its original frequency of oscillation $f_0$. It can thus be seen that the particular impedance characteristic of the crystal X with frequency acts as a compensating element to the oscillator circuit to maintain a stable oscillating frequency $f_0$.

Figure 4:
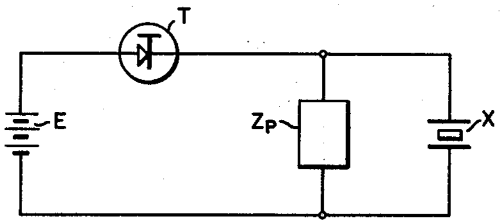
FIG. 4 is a schematic diagram of another embodiment of the present invention.
Figure 5B:
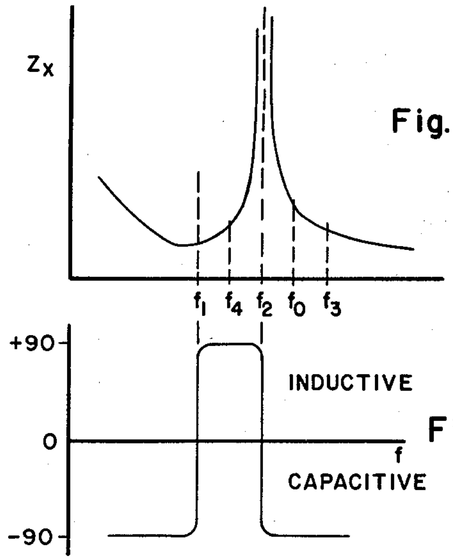

FIG. 4 shows a direct current source E having its positive terminal connected to the anode of the tunnel diode T, a crystal X in parallel with an impedance $Z_P$, and the common terminals of the parallel combination being connected respectively to the cathode of the tunnel diode T and the negative terminal of the direct current source E. The impedance $Z_P$ provides a direct current path for the tunnel diode T, which for example may be purely resistive.

The mode of operation of the oscillator circuit of FIGURE 4 is such that the stable oscillating frequency is chosen to be slightly higher than the series resonant frequency $f_1$, with the oscillating frequency being designated $f_4$, as shown in FIG. *5a*. As can be seen in FIGS. *5a* and *5b* the crystal X has an inductive characteristic in the region between $f_1$ and $f_2$. To show the stability of oscillation about the frequency $f_4$, if for example the frequency of oscillation should increase from $f_4$ toward $f_2$ the inductive characteristic of the crystal increases with the increasing impedance $Z_X$ of the crystal. As the inductance of the crystal increases the frequency of oscillation decreases so the frequency of oscillation is driven back to its original operating frequency $f_4$ by the compensating effect of the crystals impedance change with frequency. If the frequency of oscillation of the circuit should stray from the intended operating frequency $f_4$ toward frequency $f_1$, the inductive characteristic of the crystal decreases with the decrease in the impedance $Z_X$ of the crystal X, which tends to increase the frequency and drive the frequency of oscillation back toward its original frequency $f_4$. It can be seen that stable oscillation can then be obtained at the frequency $f_4$ with the oscillator circuit shown in FIG. 4 by providing a direct current path through impedance $Z_P$.

Although the present invention has been described with a certain degree of particularity, it should be understood that the present disclosure has been made only by way of example and that numerous changes in the details of construction and the combination and arrangement of parts may be resorted to without departing from the scope and spirit of the present invention.

We claim as our invention:

1. A frequency controlled oscillator circuit operative with a unidirectional bias source and including, a tunnel diode having a negative conductance region and a capacitive reactance in said negative conductance region, said tunnel diode being biased by said unidirectional bias source into said negative conductance region, and frequency control means connected in series with said tunnel diode and including a piezoelectric crystal having a predetermined resonant frequency and an inductive reactance at a frequency below said resonance frequency and an impedance connected across said crystal to provide a direct current bias path for said tunnel diode, said tunnel diode and said piezoelectric crystal forming a tuned circuit having a series resonant frequency as determined by the capacitive reactance of said tunnel diode and the inductive reactance of said piezoelectric crystal, said series resonant frequency being below said predetermined resonant frequency of said piezoelectric crystal, with said frequency control means being operative with said tunnel diode to sustain oscillations at a frequency between said predetermined resonant frequency of said crystal and said series resonant frequency.

2. A frequency controlled oscillator circuit including, a tunnel diode having a negative conductance region and a capacitive reactance therein, bias voltage means operative to bias said tunnel diode into said negative conductance region, a piezoelectric crystal having a predetermined resonant frequency and an impedance member connected in a parallel relationship with said crystal, said crystal and said impedance member being connected in series with said tunnel diode to sustain oscillation, said tunnel diode and said crystal forming a series tuned circuit including the capacitive reactance of said tunnel diode and having a predetermined series resonance frequency, with the sustained frequency of oscillation being between said predetermined resonant frequency of said crystal and said series resonant frequency.

3. A frequency controlled oscillator circuit comprising a tunnel diode having a negative conductance region and a capacitance reactance therein, bias means operative to bias said tunnel diode into said negative conductance region, and an impedance member having an inductive reactance connected in series with said tunnel diode to form a tuned circuit including the capacitive reactance of said tunnel diode, said tuned circuit having a predetermined series resonant frequency, and a piezoelectric crystal having a predetermined resonant frequency and being connected across said impedance member to sustain oscillation at a frequency between said series resonant frequency of said tuned circuit and said predetermined resonant frequency of said crystal.

4. A frequency controlled oscillator circuit comprising a series circuit including, a tunnel diode having a negative conductance region and a capacitive reactance therein, bias means operative to said tunnel diode to bias said tunnel diode into said negative conductance region and an impedance member having an inductive reactance operative in series with said tunnel diode to form a series tuned circuit including the capacitance reactance of said tunnel diode, said series tuned circuit having a predetermined series resonant frequency, and a piezoelectric crystal having a crystal resonant frequency slightly lower than said series resonant frequency and being connected across said impedance member to sustain stable oscillations at an intermediate frequency between said series and said crystal resonant frequencies.

References Cited in the file of this patent

UNITED STATES PATENTS

| | | |
|---|---|---|
| 2,043,242 | Gebhard | June 9, 1936 |
| 2,151,754 | Fair | Mar. 28, 1939 |
| 2,805,400 | Seddon | Sept. 3, 1957 |
| 2,863,056 | Pankove | Dec. 2, 1958 |
| 2,975,377 | Price et al. | Mar. 14, 1961 |
| 2,986,724 | Jaeger | May 30, 1961 |
| 2,997,604 | Shockley | Aug. 22, 1961 |
| 3,041,552 | Adamthwaite et al. | June 26, 1962 |
| 3,081,436 | Watters | Mar. 12, 1963 |